United States Patent [19]
Berman et al.

[11] Patent Number: 5,893,756
[45] Date of Patent: Apr. 13, 1999

[54] USE OF ETHYLENE GLYCOL AS A CORROSION INHIBITOR DURING CLEANING AFTER METAL CHEMICAL MECHANICAL POLISHING

[75] Inventors: Michael J. Berman; Jayashree Kalpathy-Cramer, both of West Linn, Oreg.

[73] Assignee: LSI Logic Corporation, Milpitas, Calif.

[21] Appl. No.: 08/918,483

[22] Filed: Aug. 26, 1997

[51] Int. Cl.$^6$ .................................................. H01L 21/00
[52] U.S. Cl. .................... 438/692; 438/754; 438/693; 216/38; 216/88; 216/89; 134/2
[58] Field of Search ....................... 438/691, 692, 438/693, 754; 216/38, 88, 89; 134/2, 26

[56] References Cited

U.S. PATENT DOCUMENTS

| 5,389,194 | 2/1995 | Rostoker et al. | 156/636 |
|---|---|---|---|
| 5,478,436 | 12/1995 | Winebarger et al. | 156/636.1 |
| 5,545,076 | 8/1996 | Yun et al. | 451/287 |
| 5,770,095 | 6/1998 | Sasaki et al. | 436/693 X |
| 5,773,364 | 6/1998 | Farkas et al. | 438/693 X |

OTHER PUBLICATIONS

Presentation slides at CMPUG Annual Symposium, entitled "*Alumina–SiO$_2$ Interactions Under Conditions Relevant to Post–CMP Cleaning of W–Slurries*", by I.J. Malik, R. Emami, C. Raghunath, and S. Raghavan of OnTrak Systems, Inc., Milpitas, California, Dec. 1996.

*Primary Examiner*—William Powell

[57] ABSTRACT

A post metal chemical-mechanical polishing cleaning process that effectively inhibits corrosion of a metallic plug is described. The process includes providing a partially fabricated integrated circuit (IC) substrate having a metallic plug that is formed by subjecting a metallic surface on the integrated circuit (IC) substrate to chemical-mechanical polishing, which produces a contaminated dielectric layer containing metallic contaminants. The process also includes scrubbing the IC substrate surface in the presence of a mixture including ethylene glycol and hydrofluoric acid to remove at least a portion of the contaminated dielectric layer and to effectively inhibit corrosion of the metallic plug. The mixture has ethylene glycol in an amount that is between about 2 times and about 7 times the amount of hydrofluoric acid.

22 Claims, 3 Drawing Sheets

USE OF ETHYLENE GLYCOL AS A CORROSION INHIBITOR DURING CLEANING AFTER METAL CHEMICAL MECHANICAL POLISHING

BACKGROUND OF THE INVENTION

The present invention relates to inhibiting corrosion that may result from post metal chemical-mechanical polishing (CMP) cleaning steps. More particularly, the present invention relates to inhibiting corrosion that may result from post metal chemical-mechanical polishing (CMP) cleaning steps by using a cleaning mixture including ethylene glycol and hydrofluoric acid.

A metal plug, typically a tungsten plug, is formed in a dielectric layer to provide a conductive pathway between a metallization layer and an underlying integrated circuit (IC) substrate layer and/or between two successive metallization layers disposed above the integrated circuit (IC) substrate. FIG. 1A shows a partially fabricated IC 10 that includes a tungsten layer 16, which is subjected to CMP to form tungsten plugs 24 as shown in FIG. 1B. CMP typically involves mounting a substrate face down on a holder and rotating the substrate face against a polishing pad mounted on a pallet, which in turn is rotating or is in orbital state. A slurry containing a chemical, e.g. an oxidizing agent such as $Fe(NO_3)_3$, that chemically interacts with the tungsten layer and an abrasive, e.g. alumina ($Al_2O_3$), that physically removes the tungsten layer, is flowed between the wafer and the polishing pad or on the pad near the substrate.

Referring to FIG. 1A, which shows partially fabricated IC 10 before the substrate surface undergoes CMP. A dielectric layer 12 disposed above a substrate surface 18 and having contact holes 14 is filled with tungsten. A tungsten layer 16 is also disposed atop dielectric layer 12. Some significant steps involved in forming the partially fabricated IC of FIG. 1A include blanket depositing dielectric layer 12, such as $SiO_2$, on substrate surface 18. After dielectric layer 12 is planarized, a masking layer (not shown), which typically includes photoresist, is blanket deposited over dielectric layer 12 and patterned by conventional photolithography. Next, the unmasked portions of dielectric layer 12 are etched to form contact holes 14 that provide an opening to the underlying substrate layer. After the masking layer is removed, tungsten layer 16 is blanket deposited over the substrate surface, filling contact holes 14 with tungsten. Those skilled in the art will recognize that before the contact holes are filled with tungsten, they may be filled with a conductive titanium layer (not shown to simplify illustration) and a titanium nitride barrier layer (not shown to simplify illustration). Those skilled in the art will also recognize that vias may be similarly etched to provide an opening in a dielectric layer that is disposed between two metallization layers and that metal plugs may be formed in such vias similarly.

Next, tungsten layer 16 of partially fabricated IC 10 undergoes CMP, as described above, to form tungsten plugs by removing the tungsten layer deposited above the dielectric layer. Now referring to FIG. 1B, which shows a partially fabricated IC 20 after undergoing CMP. Partially fated IC has tungsten plugs 26 formed in a dielectric layer 12 disposed atop a substrate 18. During tungsten CMP, $Fe(NO_3)_3$ oxidizes the tungsten to form tungsten oxide that is abraded by the alumina ($Al_2O_3$) particles in the slurry. In this manner, the tungsten layer above the dielectric layer is removed to form tungsten plug 26 shown in FIG. 2.

During, CMP, the top portion of the dielectric layer may fracture when the substrate surface is subjected to pressures as high as 10 psi and/or may also develop microcracks or scratches due to the abrasive action of the slurry. Unfortunately, the iron residue from the slurry migrates into the fissures and microcracks formed at the top portion of the dielectric layer, i.e. between about 50 and about 75 Ångstroms at the top of dielectric layer 12, and forms a contaminated dielectric layer 30. The removal of iron contaminants from contaminated layer 30 is important because such contaminants lower the insulating properties of the dielectric layer, making the IC susceptible to catastrophic device failures.

In order to remedy this problem, a current approach includes treating the substrate surface after tungsten CMP with about 0.5% (by volume) hydrofluoric acid in deionized water to remove the iron contaminated dielectric layer. Unfortunately, prolonged exposure of the tungsten plug to a dilute hydrofluoric acid solution results in an increased likelihood of corrosion of the tungsten plug. Corrosion has been identified in those plugs where a characteristic "seam" or a "keyhole" type structure typically formed near the middle region of the plug undergoes enlargement.

What is therefore needed is an improved process which effectively inhibits metal plug corrosion resulting from post tungsten CMP cleaning steps.

SUMMARY OF THE INVENTION

To achieve the foregoing, the present invention provides a post metal chemical-mechanical polishing (CMP) cleaning process that effectively inhibits corrosion of a metallic plug. The process includes providing a partially fabricated integrated circuit (IC) substrate having a metallic plug that is formed by subjecting a metallic surface on the integrated circuit (IC) substrate to chemical-mechanical polishing (CMP), which produces a contaminated dielectric layer containing metallic contaminants. The process also includes scrubbing the IC substrate surface in the presence of a mixture including ethylene glycol and hydrofluoric acid to remove at least a portion of the contaminated dielectric layer and to effectively inhibit corrosion of the metallic plug. The mixture has ethylene glycol in an amount that is between about 2 times and about 7 times the amount of hydrofluoric acid.

The step of scrubbing described above may be carried out in a wafer scrubber where a brush contacts the substrate surface and mechanically removes at least a portion of the contaminated dielectric layer therefrom. The mixture of ethylene glycol and hydrofluoric acid employed above may include deionized water. The amount of ethylene glycol is preferably between about 2 times and about 5 times the amount of hydrofluoric acid. The corrosion inhibiting, cleaning process described above may further include a step of removing particle residues adhering to the substrate surface by scrubbing the substrate surface with a brush in the presence of sufficient amounts of ammonium hydroxide to produce an appropriate pH on the substrate surface that facilitates the separation of the particle residues from the substrate surface and the brush. The corrosion inhibiting process described above may further still include a step of performing a spin, rinse, dry cycle whereby the IC substrate surface is rinsed with deionized water to remove chemicals from the substrate surface and dried by exposing the IC substrate surface to a radiant heat source. The metal in the metal plug of the above described process is at least one selected from the group consisting of tungsten, aluminum and copper.

In another aspect, the present invention provides a post tungsten CMP cleaning process that effectively inhibits corrosion of a tungsten plug. The process includes providing a partially fabricated IC substrate having a tungsten plug that is formed by subjecting a tungsten layer on a surface of the IC substrate to chemical-mechanical polishing, which produces particle contaminants and a contaminated dielectric layer containing metallic contaminants. The process also include a step of removing particle contaminants from the substrate surface by scrubbing with a brush the substrate surface in the presence of sufficient amounts of ammonium hydroxide such that a pH of about 9.5 and above is maintained above the substrate surface and whereby the particle contaminants separate from the substrate surface and the brush. The process further still includes scrubbing the IC substrate surface in the presence of a mixture including ethylene glycol and hydrofluoric acid to remove the contaminated dielectric layer and to effectively inhibit corrosion of the metallic plug. The mixture has ethylene glycol in an amount that is between about 2 times and about 7 times the amount of hydrofluoric acid.

The step of removing particle contaminants may include providing deionized water and about 2% by volume of ammonium hydroxide on the substrate surface. The step of scrubbing may be carried out until between about 50 and about 100 Ångstroms of the contaminated dielectric layer is removed. The amount of hydrofluoric acid in the corrosion inhibiting mixture may generally be between about 0.5% and about 1% by volume in the mixture and preferably be between about 0.5% by volume. The amount of ethylene glycol in the corrosion inhibiting mixture may be between about 1% and about 7% by volume. The particle contaminants may include tungsten oxide and the metallic contaminants may include iron or potassium.

In yet another aspect, the present invention provides a corrosion inhibiting composition for cleaning a partially fabricated IC having metallic plugs. The composition includes an effective amount of hydrofluoric acid to remove at least portions of a contaminated dielectric layer having metallic contaminants and an effective amount of ethylene glycol to inhibit corrosion of the metallic plug, wherein the amount of ethylene glycol is between about 2 times and about 7 times the amount of hydrofluoric acid.

The corrosion inhibiting composition may further include deionized water. The amount of ethylene glycol in the composition may be between about 2 times and about 5 times the amount of the hydrofluoric acid. The amount of hydrofluoric acid in the composition may generally be between about 0.5% and about 1% by volume, may preferably be about 0.5% by volume. When the composition of hydrofluoric acid is about 0.5% by volume, the amount of ethylene glycol may generally be between about 1% and about 3.5% by volume and may preferably be between about 1% and about 2.5% by volume. The amount of ethylene glycol in the composition may generally be between about 1% and about 7% by volume.

These and other features of the present invention will be described in more detail below in the detailed description of the invention and in conjunction with the following figures.

DETAILED DESCRIPTION OF THE PREFERRED EMBODIMENTS

The present invention provides a composition and process for inhibiting corrosion in metal plugs that may result from post metal chemical-mechanical polishing (CMP) cleaning steps. In the following description, numerous specific details are set forth in order to fully illustrate a preferred embodiment of the present invention. It will be apparent, however, that the present invention may be practiced without limitation to some specific details presented herein. By way of example, contact plugs 14 of FIG. 1, as described above, may be filled with other metals or conductive materials, besides tungsten, such as aluminum and copper and then the metal on the substrate surface may undergo chemical-mechanical polishing (CMP). As a further example, the composition of the slurry employed during CMP may include other oxidizing agents, besides ferric nitric (Fe $(NO_3)_3$, such as hydrogen peroxide ($H_2O_2$) and potassium iodate ($KIO_3$) to oxidize the metal composition of the plug. It should be understood, therefore, that the contaminants in the contaminated dielectric layer may include potassium and other metallic contaminants, besides iron, originating from the slurry composition.

The present invention recognizes the need for inhibiting corrosion in metal plugs that may result from post metal CMP cleaning steps. According to the present invention, cleaning of a contaminated dielectric layer on an integrated circuit (IC) substrate surface is carried out by scrubbing the integrated circuit (IC) substrate surface in the presence of a corrosion inhibiting composition. The corrosion inhibiting composition of the present invention includes hydrofluoric acid and ethylene glycol to remove the contaminated dielectric layer and inhibit corrosion of the metal plug.

Figure 2:
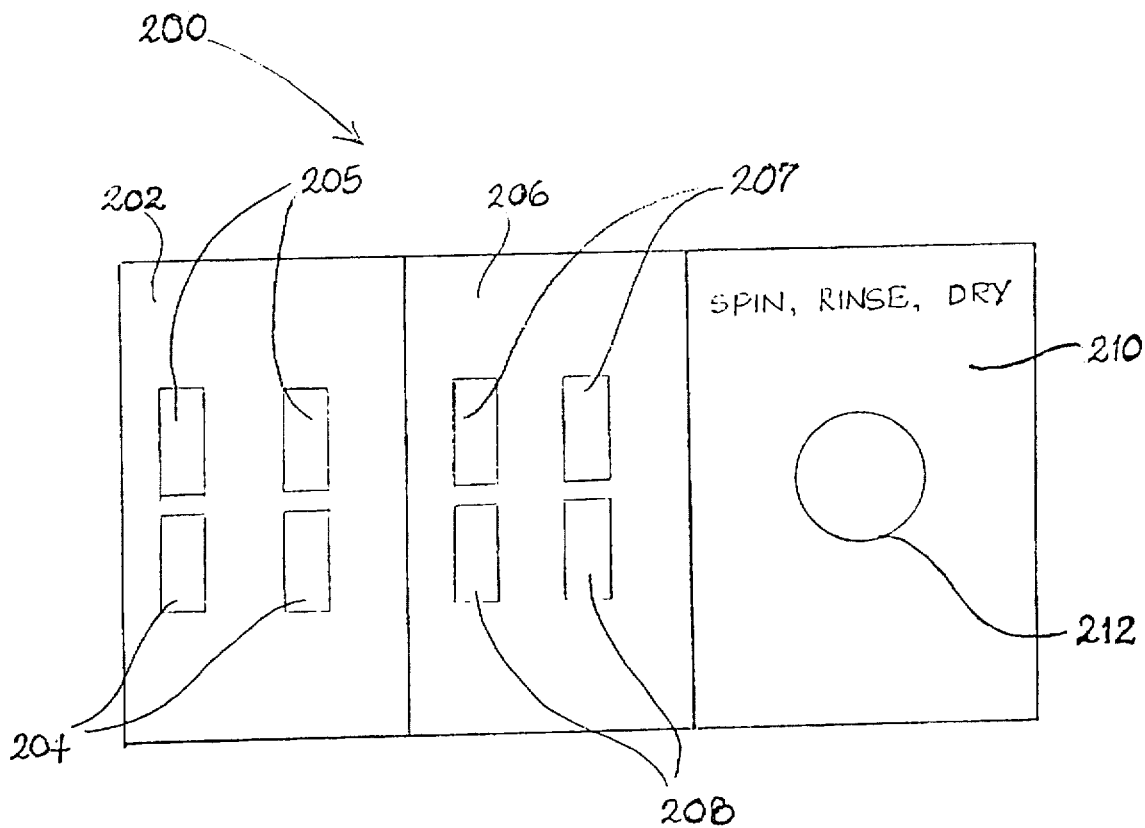
FIG. 2 shows a simple schematic diagram of the major components in a wafer scrubber, which may be employed during post metal CMP cleaning steps, according to one embodiment of the present invention.

Post metal CMP cleaning processes according to the present invention may be carried out in any wafer scrubber system. In one preferred embodiment, cleaning processes of the present invention are carried out in a DSS 200 Series 2 Wafer Scrubber System, commercially available from OnTrak Systems, of San Jose, Calif. FIG. 2 shows the major, relevant components of this wafer scrubber system. It should be borne in mind that the substrate cleaning process according to the present invention is not limited to any particular wafer scrubber configuration and that any chamber fitted with brushes to contact the substrate surface will work. Wafer scrubber system 200, as shown in FIG. 2, may be configured to clean any IC substrate, however, it is preferably employed to clean semiconductor wafer substrates. System 200 includes two brush boxes, a primary chamber 202 and a secondary chamber 206, and a spin, rinse, dry station 210. Each of chambers 202 and 206, include double sided scrubbers, i.e. they come equipped with two brushes 205 (for chamber 202) and 207 (for chamber 206) mounted on top and two brushes 204 (for chamber 202 ) and 208 (for chamber 206) mounted on the bottom such that a substrate placed between the two sets of brushes 204 and 205 or 208 and 207 would have both of its surfaces, scrubbed or mechanically cleaned. Spin, rinse, dry station 212 includes a chuck 212, upon which the substrate is secured to undergo rinsing and then drying by the radiant heat produced by bright lights (not shown to simplify illustration).

Figure 3:
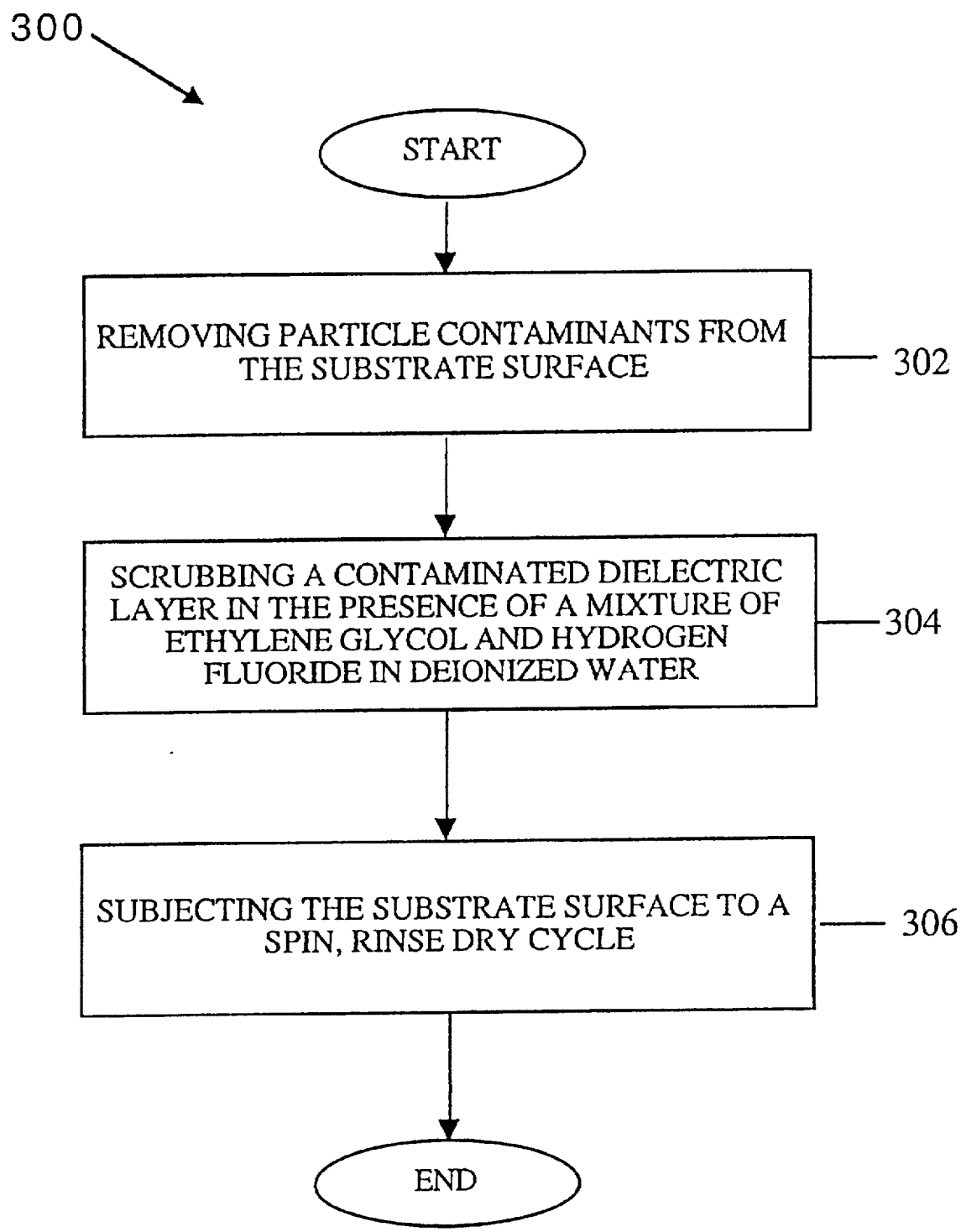
FIG. 3 shows a flowchart of a post tungsten CMP cleaning process, according to one embodiment of the present invention that uses ethylene glycol and hydrofluoric acid in a mixture to inhibiting corrosion of metal plugs.
Figure 1A:
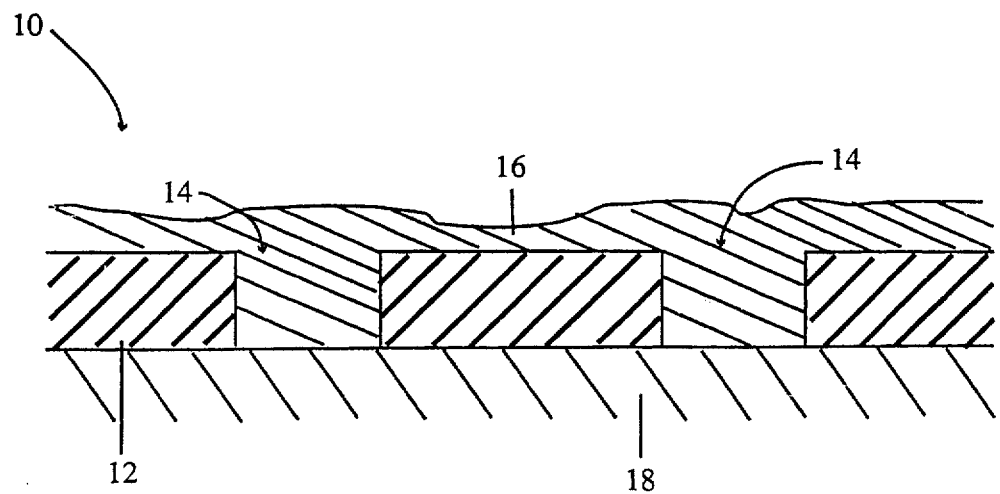
Figure 1B:
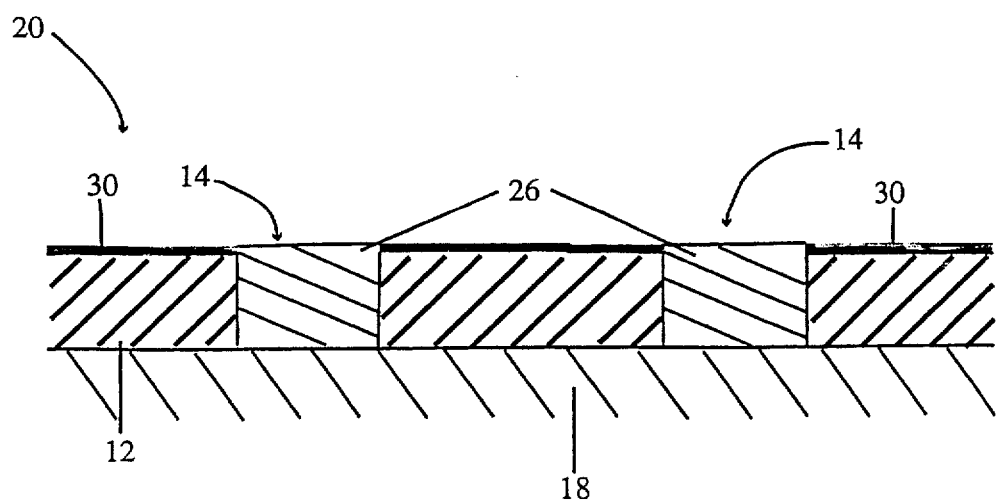
Figure 2:
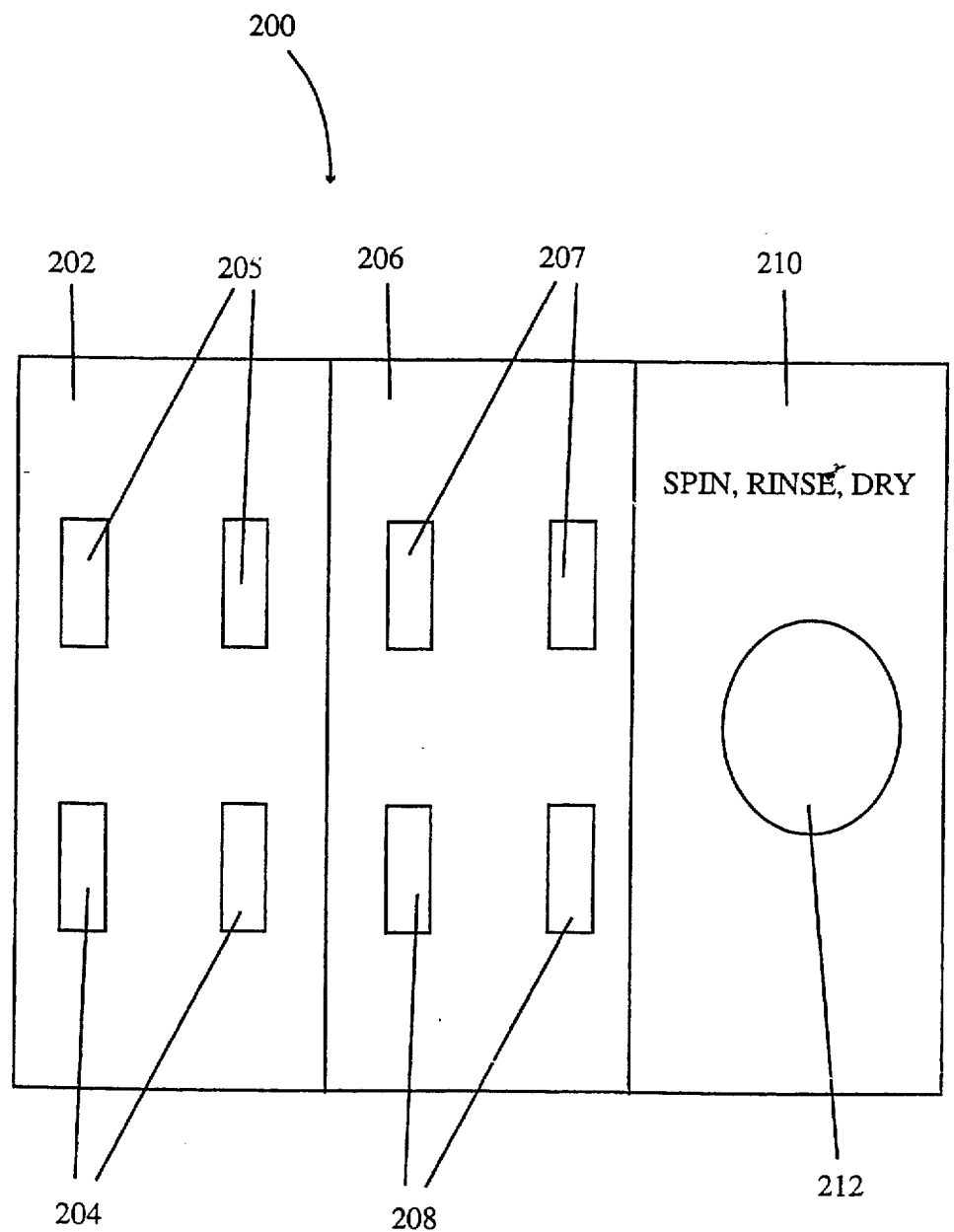
Figure 3:
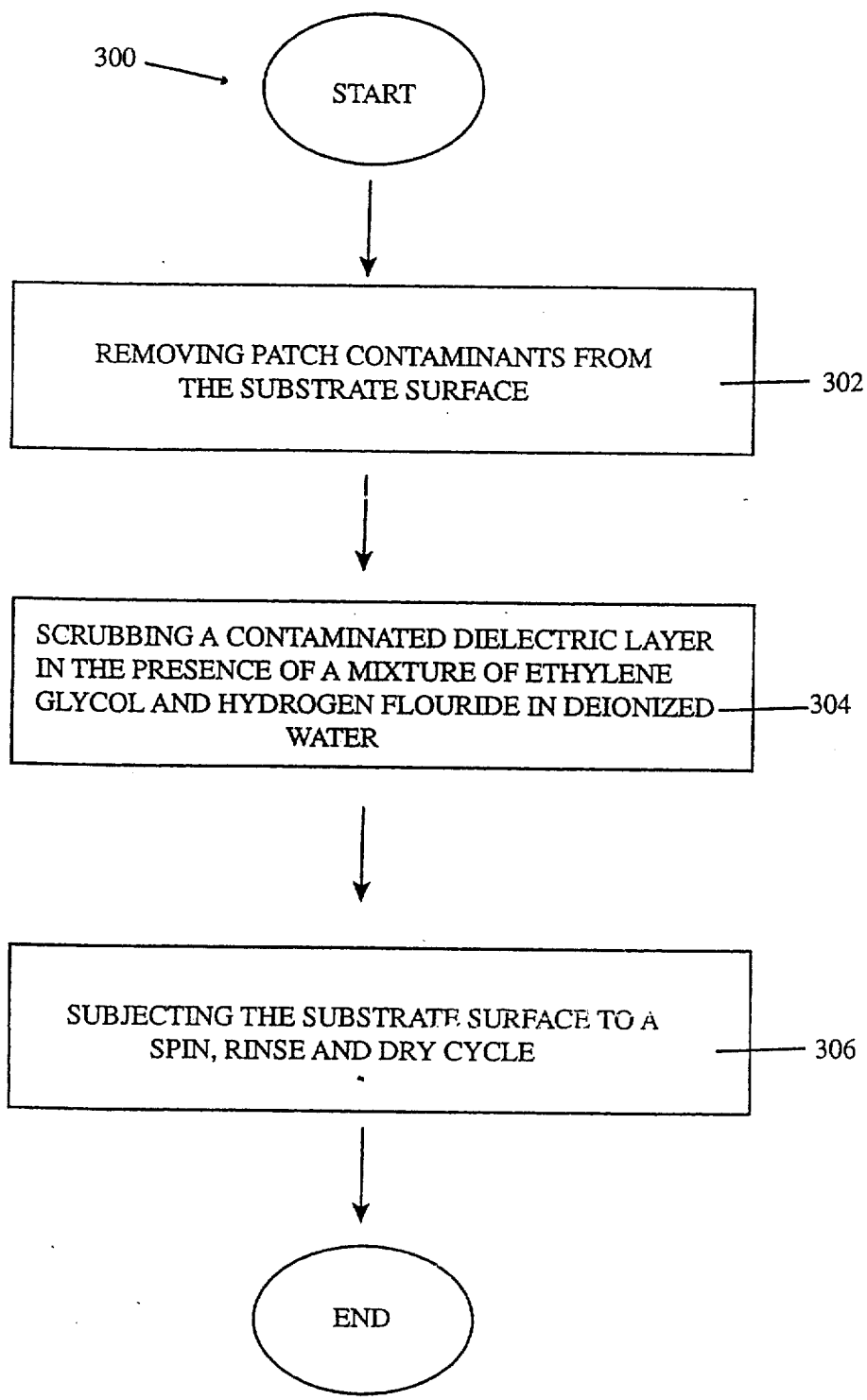

FIG. 3 shows a flowchart of one embodiment of the inventive post metal CMP cleaning processes that may be implemented in the wafer scrubber system of FIG. 2. The process of FIG. 3 removes a contaminated dielectric layer, e.g., contaminated dielectric layer 30 of FIG. 1B, and effectively inhibits corrosion of metal plugs, e.g., tungsten plug 26 of FIG. 1B. Before a corrosion inhibiting cleaning process 300 of FIG. 3 begins, a partially fabricated IC substrate like the one shown in FIG. 1B is formed by the process described above.

Cleaning process 300 may begin with a step 302, which includes removing particle contaminants from a surface of the partially fabricated IC substrate. The particle contaminants, such as metal oxides, removed in this step typically originate from the slurry composition or may be part of the eroded material from the substrate surface during CMP. Typically such metal oxides adhere to the substrate surface due to the build up of electrostatic charge on the substrate surface. During step 302, a cleaning mixture is introduced inside primary chamber 202 of FIG. 2 to provide an appropriate pH on the substrate surface, and thereby effectively produce a zeta potential, also known in the art as an electrostatic potential, for the metal oxide, brushes 204 and 205 of FIG. 2 and the dielectric layer that facilitates the separation of the metal oxide from the dielectric layer and the brushes. By the action of the rotating brushes 204 and 205 (of FIG. 2), which physically contact the substrate surface, such metal oxide particles are effectively removed from the substrate surface. By way of example, for cleaning tungsten oxide particles (produced by tungsten CMP) from a substrate surface, a cleaning mixture containing 2% (in volume) ammonium hydroxide ($NH_4OH$) and deionized water may be introduced inside primary chamber 202 of FIG. 2. At this composition, the cleaning mixture effectively provides a pH on the substrate surface that is greater than or equal to about 9.5, which produces the necessary repulsion forces for the separation of tungsten oxide from the substrate surface and the brushes. As mentioned above, the separated tungsten oxide particles are removed from the substrate surface by the action of brushes 204 and 205 of FIG. 2. In this manner, the substrate surface is rendered clean of any particle contaminants, e.g. tungsten oxide, that may be produced during tungsten CMP.

Figure 1A:
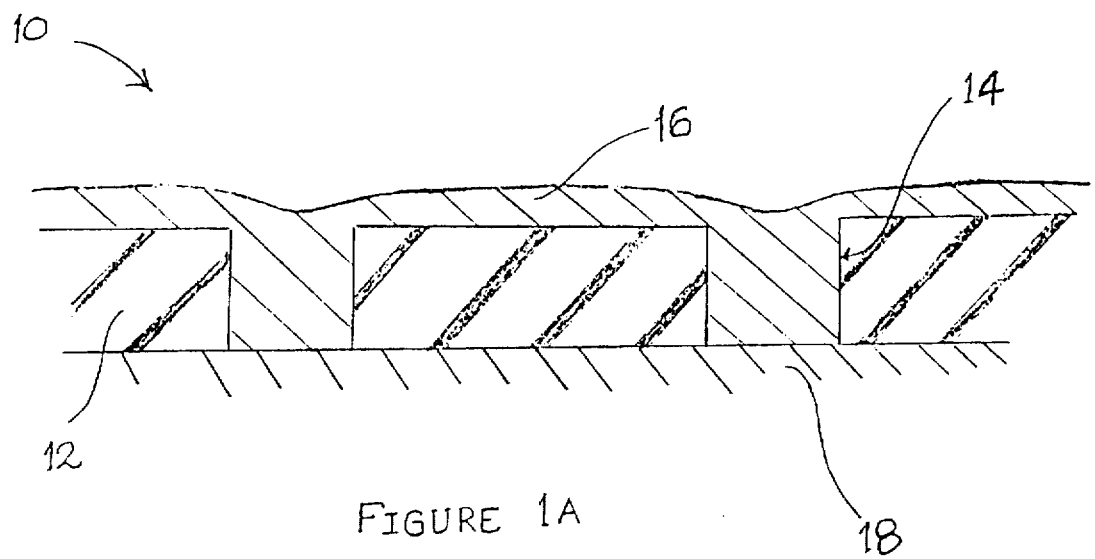
FIG. 1A shows a partially fabricated integrated circuit (IC) before undergoing chemical-mechanical polishing (CMP).
Figure 1B:
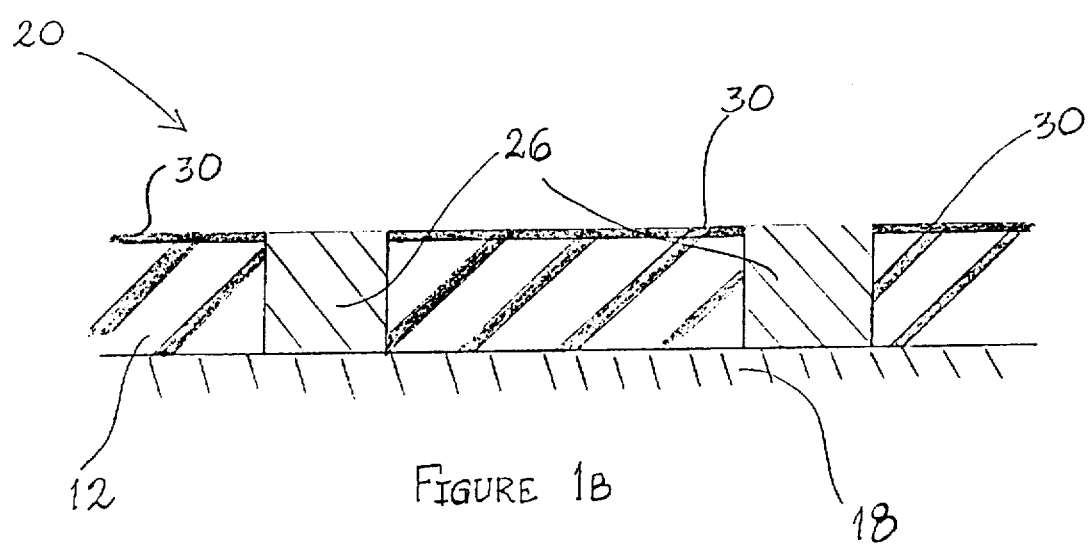
FIG. 1B shows a partially fabricated IC that includes tungsten plugs formed by subjecting the partially fabricated IC of FIG. 1A to chemical-mechanical polishing (CMP).

In a step 304, a contaminated dielectric layer, e.g., contaminated dielectric layer 30 of FIG. 1B, enriched with metal contaminants embedded into a dielectric layer during metal CMP, undergoes scrubbing in the presence of a corrosion inhibiting composition of a post metal CMP cleaning mixture. By way of example, in chamber 206 of FIG. 2, one of brushes 207 and 208 scrub contaminated dielectric layer 30 of FIG. 1B on the substrate surface in the presence of a corrosion inhibiting composition.

The corrosion inhibiting composition of the cleaning mixture, according to one embodiment of the present invention, contains hydrofluoric acid, ethylene glycol and deionized water. Hydrofluoric acid may generally be present in an effective amount, e.g. between about 0.5% and about 1%, in the mixture to facilitate the removal of the contaminated dielectric layer from the substrate surface. By way of example, a cleaning mixture containing about 0.5% (in volume) of hydrofluoric acid may effectively remove between about 50 and about 100 Ångstroms of the iron contaminated dielectric layer 30 of FIG. 1B.

Ethylene glycol may be present in effective amounts in the cleaning mixture to inhibit corrosion of the metal plug. One skilled in the art will, therefore, recognize that the amount of ethylene glycol in the mixture will vary depending on the concentration of by fluoric acid present in the cleaning mixture. The amount of ethylene glycol present in the mixture may generally be between about 2 and about 7 times the amount of hydrofluoric acid present in the mixture and may preferably be between about 2 and about 5 times the amount of hydrofluoric acid present in the mixture. In the above example, where the cleaning mixture contains 0.5% of hydrofluoric acid, the amount of ethylene glycol in the mixture will therefore be between about 1% and about 3.5% and preferably be between about 1% and about 2.5%. Accordingly, when the cleaning mixture contains about 1% hydrofluoric acid, the amount of ethylene glycol will be between about 2% and about 7% and preferably be between about 2% and about 5%.

Step 304 may be carried out until all of the contaminated dielectric layer is removed. According to the cleaning process of the present invention, scrubbing with the cleaning mixture inhibits the corrosion of the metal plug and the likelihood of degradation of the plug is reduced significantly.

Finally in a step 306, any chemical residue from the cleaning mixtures of steps 302 and 304 mentioned above are removed from the substrate surface by cleaning the substrate surface in spin, rinse, dry station 210 of FIG. 2. During a typical spin, rinse, dry cycle, the substrate is secured on chuck 212 of FIG. 2 and sprayed with water to rinse off the chemicals on the substrate surface. Next, the chuck switches to a high speed rotation, which literally throws the water off the substrate surface. The substrate surface is then dried by the radiant heat that may be generated by bright lights (not shown to simplify illustration) mounted on top of station 210 of FIG. 2.

Although the ongoing invention has been descend in some detail for purposes of clarity of understanding, it will be apparent that certain changes and modifications may be practiced within the scope of the appended claims. For example, while the specification describes inhibiting metal plug corrosion in a wafer scrubber, there is no reason why in principle ethylene glycol cannot be used in other post CMP cleaning steps to inhibit metal plug corrosion. Therefore, the present embodiments are to be considered as illustrative and not restrictive, and the invention is not to be limited to the details given herein, but may be modified within the scope of the appended claims.

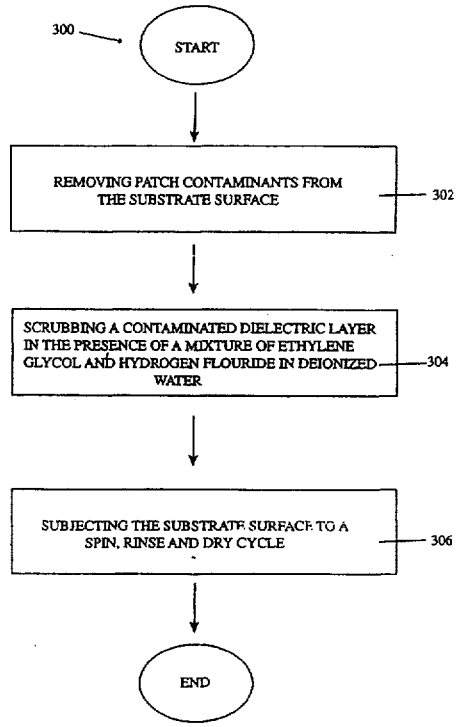

What is claimed is:

1. A post metal chemical-mechanical polishing cleaning process that effectively inhibits corrosion of a metallic plug, comprising:

providing a partially fabricated integrated circuit (IC) substrate including a metallic plug that is formed by subjecting a metallic surface of said integrated circuit (IC) substrate to chemical-mechanical polishing, which produces a contaminated dielectric layer containing metallic contaminants; and scrubbing said IC substrate surface in the presence of a mixture including ethylene glycol and hydrofluoric acid to remove at least a portion of said contaminated dielectric layer and to effectively inhibit corrosion of said metallic plug, wherein said mixture has ethylene glycol in an amount that is between about 2 times and about 7 times the amount of hydrofluoric acid.

2. The process of claim 1, wherein the step of scrubbing is carried out in a wafer scrubber where a brush contacts the substrate surface and mechanically removes at least a portion of the contaminated dielectric layer therefrom.

3. The process of claim 1, wherein the mixture includes deionized water.

4. The process of claim 1, wherein the amount of ethylene glycol is between about 2 times and about 5 times the amount of hydrofluoric acid.

5. The process of claim 1, further comprising a step of removing particle contaminants produced during the chemical-mechanical polishing process and adhering to the substrate surface from the substrate surface by scrubbing the substrate surface with a brush in the presence of sufficient amounts of ammonium hydroxide to produce an appropriate pH on the substrate surface that facilitates the separation of the particle contaminants from the substrate surface and the brush.

6. The process of claim 1, further comprising a step of performing a spin, rinse, dry cycle whereby the IC substrate surface is rinsed with deionized water to remove chemicals from the IC substrate surface and dried by exposing the IC substrate surface to a radiant heat source.

7. The process of claim 1, wherein said metal comprises at least one selected from the group consisting of tungsten, aluminum and copper.

8. A post tungsten chemical-mechanical polishing cleaning 15 process that effectively inhibits corrosion of a tungsten plug, comprising:

provinding a partially fabricated IC substrate including a tungsten plug that is formed by subjecting a tungsten layer on a surface of said IC substrate to chemical-mechanical polishing, which produces particle contaminants and a contaminated dielectric layer containing metallic contaminants;

removing particle contaminants from said substrate surface by scrubbing with a brush said substrate surface in the presence of sufficient amounts of ammonium hydroxide such that a pH of about 9.5 and above is maintained above said substrate surface and whereby tungsten oxide separates from said substrate surface and said brush; and scrubbing said IC substrate surface in the presence of a mixture including ethylene glycol and hydrofluoric acid to thereby remove said contaminated dielectric layer and to effectively inhibit corrosion of said metallic plug, wherein said mixture has ethylene glycol in an amount that is between about 2 times and about 7 times the amount of hydrofluoric acid.

9. The process of claim 8, wherein said step of removing comprises providing deionized water and about 2% by volume of said ammonium hydroxide on said substrate surface.

10. The process of claim 8, wherein said step of scrubbing is carried out until between about 50 and about 100 Ångstroms of said contaminated dielectric layer is removed.

11. The process of claim 8, wherein said amount of hydrofluoric acid is between about 0.5% and about 1% by volume in said mixture.

12. The process of claim 8, wherein said amount of ethylene glycol is between about 1% and about 7% by volume in said mixture.

13. The process of claim 8, wherein the particle contaminants comprise tungsten oxide.

14. The process of claim 8, wherein the metallic contaminants comprise iron or potassium.

15. A corrosion inhibiting composition for cleaning a partially fabricated IC having metallic plugs, comprising:

an effective amount of hydrofluoric acid to remove at least portions of a contaminated dielectric layer having metallic contaminants; and an effective amount of ethylene glycol to inhibit corrosion of said metallic plug, wherein said amount of ethylene glycol is between about 2 times and about 7 times said amount of hydrofluoric acid.

16. The composition of claim 15, further comprising deionized water.

17. The composition of claim 15, wherein the amount of ethylene glycol is between about 2 times and about 5 times the amount of the hydrofluoric acid.

18. The composition of claim 15, wherein the amount of hydrofluoric acid in the composition is between about 0.5% and about 1% by volume.

19. The composition of claim 18, wherein the amount of hydrofluoric acid in the composition is about 0.5% by volume.

20. The composition of claim 19, wherein the amount of ethylene glycol is between about 1% and about 3.5% by volume.

21. The composition of claim 20, wherein the amount of ethylene glycol is between about 1% and about 2.5% by volume.

22. The composition of claim 15, wherein the amount of ethylene glycol in the composition is between about 1% and about 7% by volume.

* * * * *

UNITED STATES PATENT AND TRADEMARK OFFICE
CERTIFICATE OF CORRECTION

PATENT NO. : 5,893,756

DATED : April 13, 1999

INVENTOR(S) : Michael J. Berman; Jayashree Kalpathy-Cramer

It is certified that error appears in the above-identified patent and that said Letters Patent is hereby corrected as shown below:

<u>In the Drawings</u>:

Replace Figures 1A, 1B, 2 and 3 with Figures 1A, 1B, 2 and 3, as shown on the attached pages.

The title page, showing the illustrative figure, should be deleted and substitute therefore the attached title page.

Signed and Sealed this

Sixth Day of June, 2000

Attest:

Q. TODD DICKINSON

*Attesting Officer*     *Director of Patents and Trademarks*

United States Patent [19]

Berman et al.

[11] Patent Number: 5,893,756
[45] Date of Patent: Apr. 13, 1999

[54] USE OF ETHYLENE GLYCOL AS A CORROSION INHIBITOR DURING CLEANING AFTER METAL CHEMICAL MECHANICAL POLISHING

[75] Inventors: Michael J. Berman; Jayashree Kalpathy-Cramer, both of West Linn, Oreg.

[73] Assignee: LSI Logic Corporation, Milpitas, Calif.

[21] Appl. No.: 08/918,483

[22] Filed: Aug. 26, 1997

[51] Int. Cl.$^6$ ................................................. H01L 21/00
[52] U.S. Cl. ...................... 438/692; 438/754; 438/693; 216/38; 216/88; 216/89; 134/2
[58] Field of Search ..................... 438/691, 692, 438/693, 754; 216/38, 88, 89; 134/2, 26

[56] References Cited

U.S. PATENT DOCUMENTS

| | | | |
|---|---|---|---|
| 5,389,194 | 2/1995 | Rostoker et al. | 156/636 |
| 5,478,436 | 12/1995 | Winebarger et al. | 156/636.1 |
| 5,545,076 | 8/1996 | Yun et al. | 451/287 |
| 5,770,095 | 6/1998 | Sasaki et al. | 436/693 X |
| 5,773,364 | 6/1998 | Farkas et al. | 438/693 X |

OTHER PUBLICATIONS

Presentation slides at CMPUG Annual Symposium, entitled "*Alumina–SiO$_2$ Interactions Under Conditions Relevant to Post–CMP Cleaning of W–Slurries*", by I.J. Malik, R. Emami, C. Raghunath, and S. Raghavan of OnTrak Systems, Inc., Milpitas, California, Dec. 1996.

*Primary Examiner*—William Powell

[57] ABSTRACT

A post metal chemical-mechanical polishing cleaning process that effectively inhibits corrosion of a metallic plug is described. The process includes providing a partially fabricated integrated circuit (IC) substrate having a metallic plug that is formed by subjecting a metallic surface on the integrated circuit (IC) substrate to chemical-mechanical polishing, which produces a contaminated dielectric layer containing metallic contaminants. The process also includes scrubbing the IC substrate surface in the presence of a mixture including ethylene glycol and hydrofluoric acid to remove at least a portion of the contaminated dielectric layer and to effectively inhibit corrosion of the metallic plug. The mixture has ethylene glycol in an amount that is between about 2 times and about 7 times the amount of hydrofluoric acid.

22 Claims, 3 Drawing Sheets